US012757480B2

(12) United States Patent
Lin

(10) Patent No.: US 12,757,480 B2
(45) Date of Patent: Oct. 6, 2026

(54) STRUCTURE WITH CAPACITOR AND FIN TRANSISTOR AND FABRICATING METHOD OF THE SAME

(71) Applicant: UNITED MICROELECTRONICS CORP., Hsin-Chu City (TW)

(72) Inventor: Chun-Hao Lin, Kaohsiung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 358 days.

(21) Appl. No.: 18/381,639

(22) Filed: Oct. 19, 2023

(65) Prior Publication Data

US 2025/0089349 A1 Mar. 13, 2025

(30) Foreign Application Priority Data

Sep. 8, 2023 (TW) ................................ 112134194

(51) Int. Cl.

| | |
|---|---|
| ***H10D 1/66*** | (2025.01) |
| ***H10D 1/68*** | (2025.01) |
| ***H10D 30/62*** | (2025.01) |
| ***H10D 84/80*** | (2025.01) |
| ***H10P 30/20*** | (2026.01) |
| ***H10W 10/00*** | (2026.01) |
| ***H10W 10/17*** | (2026.01) |

(52) U.S. Cl.
CPC ............. *H10D 84/811* (2025.01); *H10D 1/68* (2025.01); *H10D 30/6211* (2025.01); *H10P 30/204* (2026.01); *H10P 30/208* (2026.01); *H10W 10/014* (2026.01); *H10W 10/17* (2026.01)

(58) Field of Classification Search
CPC ........................................................ H10D 1/66
See application file for complete search history.

(56) References Cited

U.S. PATENT DOCUMENTS

| | | | | |
|---|---|---|---|---|
| 2021/0057488 | A1* | 2/2021 | Hwu | H10N 70/8833 |
| 2023/0378376 | A1* | 11/2023 | Yang | H10D 1/047 |
| 2024/0339457 | A1* | 10/2024 | Guo | H10D 86/201 |

* cited by examiner

*Primary Examiner* — Christopher A Johnson
(74) *Attorney, Agent, or Firm* — Winston Hsu

(57) ABSTRACT

A structure with a capacitor and a fin transistor includes a substrate. The substrate includes a capacitor region and a fin transistor region. A mesa is disposed within the capacitor region of the substrate. The mesa protrudes from a surface of the substrate. The mesa includes a top surface and two sloping surfaces. Each of the sloping surfaces connects to the top surface of the mesa and the surface of the substrate. A doping region is disposed within the mesa. A capacitor electrode is only disposed on the top surface. A capacitor dielectric layer is disposed between the capacitor electrode and the doping region.

5 Claims, 10 Drawing Sheets

STRUCTURE WITH CAPACITOR AND FIN TRANSISTOR AND FABRICATING METHOD OF THE SAME

BACKGROUND OF THE INVENTION

1. Field of the Invention

The present invention relates to a structure with a capacitor and a fin transistor and a manufacturing method thereof. In particular, the present invention relates to a combined manufacturing process of a fin transistor and a capacitor to produce a capacitor with low capacitance variation within a predetermined voltage range.

2. Description of the Prior Art

Capacitors are energy storage components that are essential in analog and digital electronic circuits. These components are used for timing, generating waves, blocking DC and coupling AC signals, filtering and smoothing waves, and storing energy. Various capacitors have appeared on the market. With the integration of analog circuits into digital circuits of metal oxide semiconductors, capacitors begin to dominate analog circuits. Integrated circuits typically contain a variety of capacitors. One type of which is a metal oxide semiconductor capacitor. Such metal oxide semiconductor capacitors are typically formed by using only the fabrication steps required to form semiconductor components. In this way, number of steps of fabricating circuits can then be minimized.

The capacitance represents the capacity of the capacitor to store charge. The capacitance is affected by the applied voltage. Therefore, when applied voltage is changed, the capacitance will be inconsistent. Accordingly, in practical applications, metal oxide semiconductor capacitors with a capacitance that can maintain low variation in a specific voltage range are needed.

SUMMARY OF THE INVENTION

In view of this, the present invention provides a combined fabricating process of a fin transistor and a capacitor to produce a capacitor with a capacitance that only changes a little within a predetermined voltage range.

According to a preferred embodiment of the present invention, a structure with a capacitor and a fin transistor includes a substrate divided into a capacitor region and a fin transistor region. A mesa is disposed within the capacitor region of the substrate, wherein the mesa protrudes from a surface of the substrate, the mesa includes a top surface and two sloping surfaces, and each of the sloping surfaces connects the top surface of the mesa to the surface of the substrate. A doping region is disposed within the mesa. A capacitor electrode is only disposed on the top surface of the mesa. A capacitor dielectric layer is disposed between the capacitor electrode and the doping region.

According to another preferred embodiment of the present invention, a fabricating method of a structure with a capacitor and a fin transistor includes providing a substrate, wherein the substrate includes a capacitor region and a fin transistor region. Next, a mesa is formed to be disposed within the capacitor region of the substrate, wherein the mesa protrudes from a surface of the substrate, the mesa includes a top surface and two sloping surfaces, and each of the sloping surfaces connects the top surface of the mesa to the surface of the substrate. Then, a doping region is formed to be disposed within the mesa. After that, a capacitor electrode is formed to be only disposed on the top surface of the mesa. Finally, a capacitor dielectric layer is formed to be disposed between the capacitor electrode and the doping region.

According to yet another preferred embodiment of the present invention, a fabricating method of a structure with a capacitor and a fin transistor includes providing a substrate, wherein the substrate includes a capacitor region and a fin transistor region. Next, a mesa is formed to be disposed within the capacitor region of the substrate and a fin structure is formed to be disposed within the fin transistor region of the substrate, wherein the mesa protrudes from a surface of the substrate, the mesa includes a top surface and two sloping surfaces, and each of the sloping surfaces connects the top surface of the mesa to the surface of the substrate. After that, a shallow trench isolation is formed to cover the substrate, wherein a top surface of the shallow trench isolation, the top surface of the mesa, and a top surface of the fin structure are aligned with each other. Then, a dopant implantation process is performed to form a doping region in the mesa. Subsequently, the shallow trench isolation is etched back. Then, a capacitor dielectric layer is formed to cover the mesa. Finally, a capacitor electrode is formed to be only disposed on the top surface of the mesa.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to 6 depict a fabricating method of a structure with a capacitor and a fin transistor according to a preferred embodiment of the present invention, wherein:

FIG. 1 depicts a substrate with a capacitor region and a fin transistor region.

FIG. 2 is a fabricating stage in continuous of FIG. 1;

FIG. 3 is a fabricating stage in continuous of FIG. 2;

FIG. 4 is a fabricating stage in continuous of FIG. 3;

FIG. 5 is a fabricating stage in continuous of FIG. 4; and

FIG. 6 is a fabricating stage in continuous of FIG. 5.

DETAILED DESCRIPTION

FIG. 1 to 6 depict a fabricating method of a structure with a capacitor and a fin transistor according to a preferred embodiment of the present invention.

Figure 1:
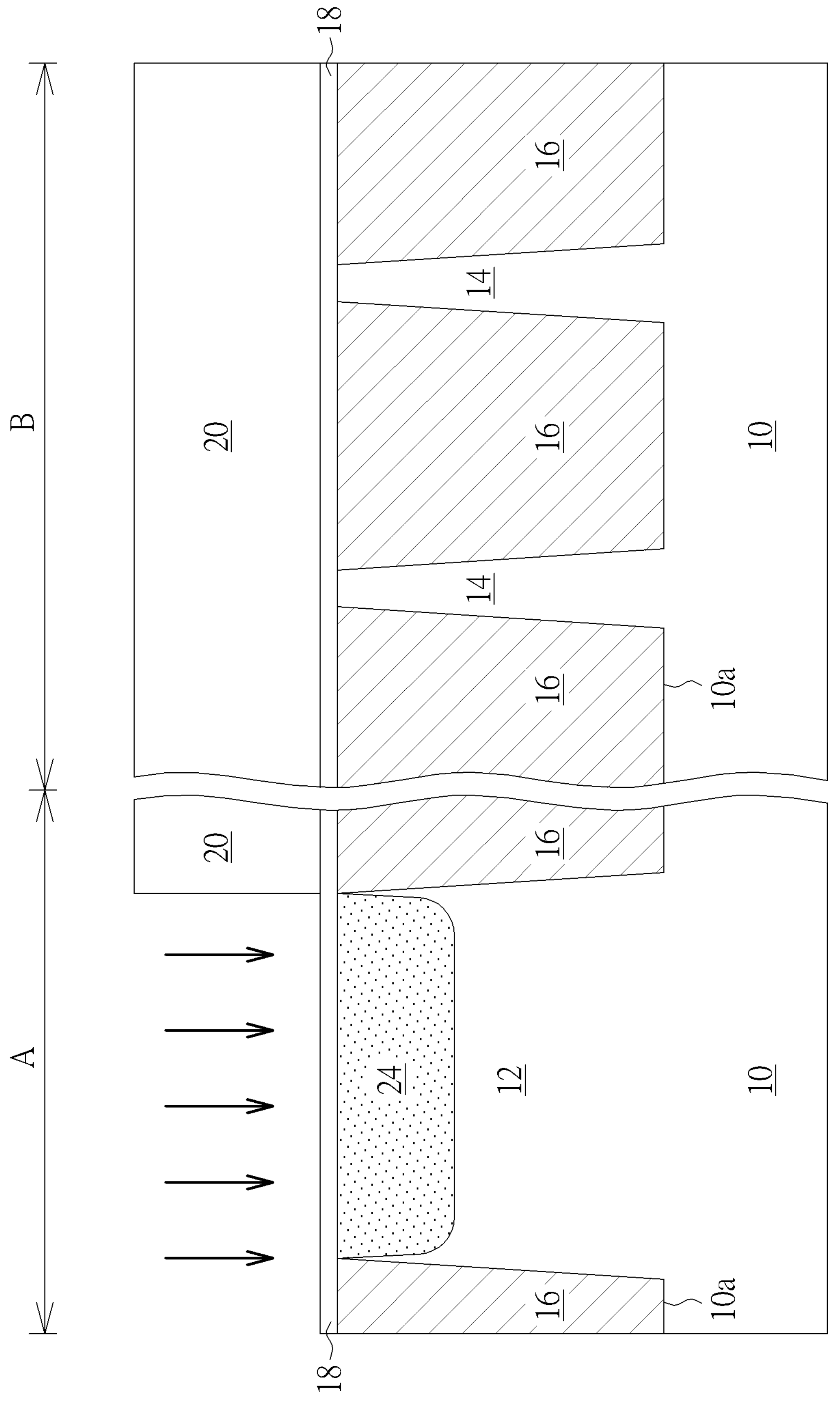

As shown in FIG. 1, a substrate 10 is provided. The substrate 10 is divided into a capacitor region A and a fin transistor region B. Then, a mesa 12 is formed to be disposed in the capacitor region A of the substrate 10. The mesa 12 protrudes from a surface **10*a* of the substrate 10. While forming the mesa 12, numerous fin structures 14 are simultaneously formed and disposed in the fin transistor region B, wherein each of the fin structures 14 protrudes from the surface 10*a* of the substrate 10. The mesa 12 and the fin structures 14 can be formed by etching the substrate 10. Then, a shallow trench isolation (STI) 16 is formed at two sides of the mesa 12 and two sides of each of the fin structures 14. At this point, the top surface of the mesa 12, the top surface of the STI 16 and the top surface of each of the fin structures 14 are aligned with each other. Then, a pad oxide 18 is formed to cover the top surface of the mesa 12, the top surface of the STI 16 and the top surface of the fin structure 14. Next, a mask layer 20 is formed to cover the fin transistor region B and expose the capacitor region A. Then, an ion implantation process is performed to implant ions into the mesa 12 in the capacitor region A to form a doping region 24. According to a preferred embodiment of the present invention, dopants implanted in the capacitor region A may include phosphorus, arsenic, boron, gallium, or other N-type or P-type dopants. For example, arsenic dopants with a concentration of 500E15 atoms/$cm^2$ can be implanted into the capacitor region A to form the doping region 24** by using an operation power of 15,000 electron volts.

Figure 2:
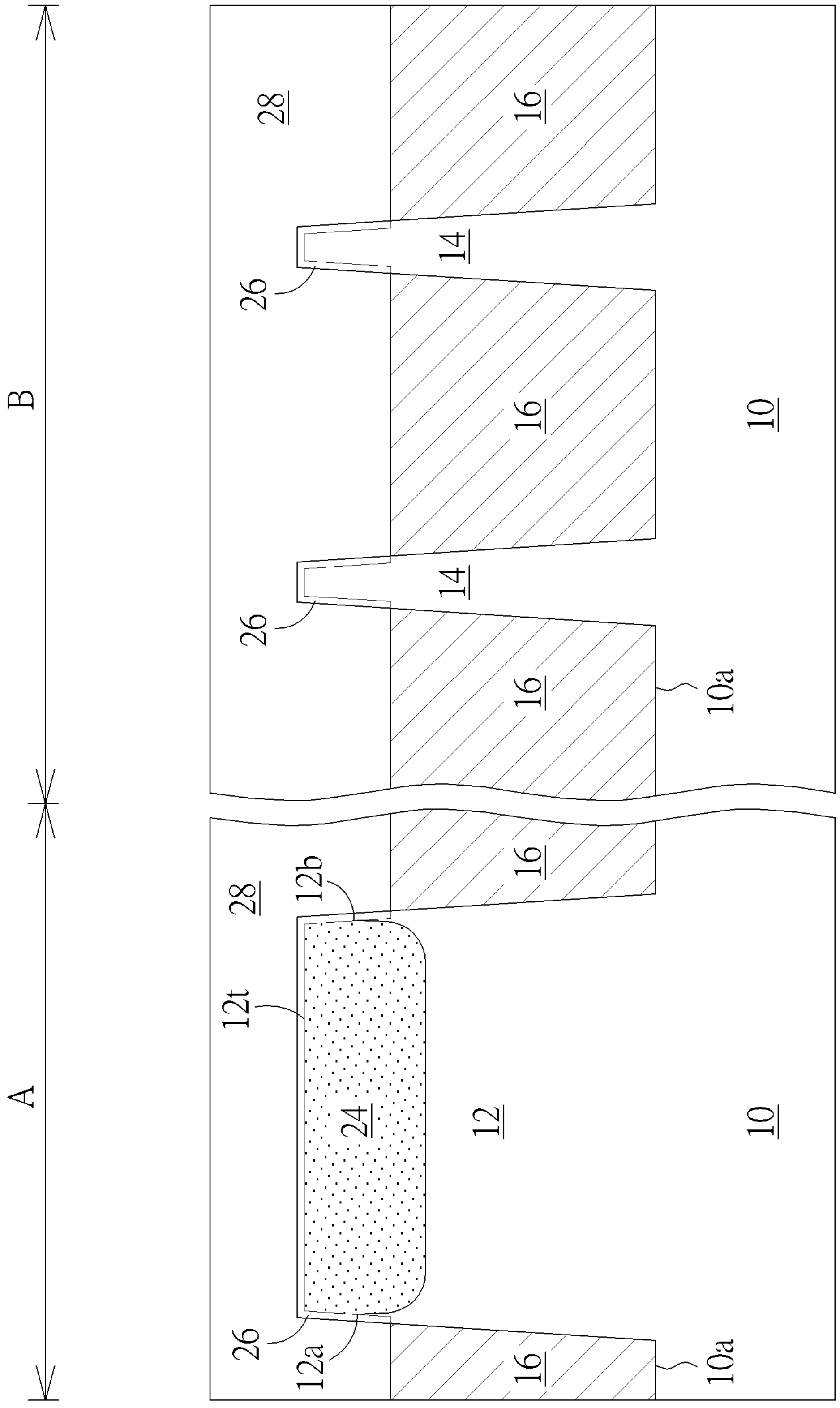

As shown in FIG. 2, the mask layer 20 is removed, and then another mask layer (not shown) can be formed to cover the capacitor region A. Next, dopants are implanted in the fin transistor region B to adjust the threshold voltage of the fin transistor, and then the mask layer is removed. Next, the pad oxide layer 18 and the STI 16 are etched back to make part of the mesa 12 protrude from the STIs 16 and part of each of the fin structures 14 protrude from the STI 16. Subsequently, an oxidation process, such as an in-situ steam generation process, is performed to form a silicon oxide layer 26 to cover the mesa 12 and the fin structure 14. In details, the oxidation process oxidizes the shallow surface of the mesa 12 protruding from the STI 16 and the shallow surface of the fin structures 14 protruding from the STI 16. Later, a polysilicon layer 28 is formed to entirely cover the capacitor region A and the fin transistor region B. The polysilicon layer 28 is preferably formed by using a deposition process.

Figure 3:
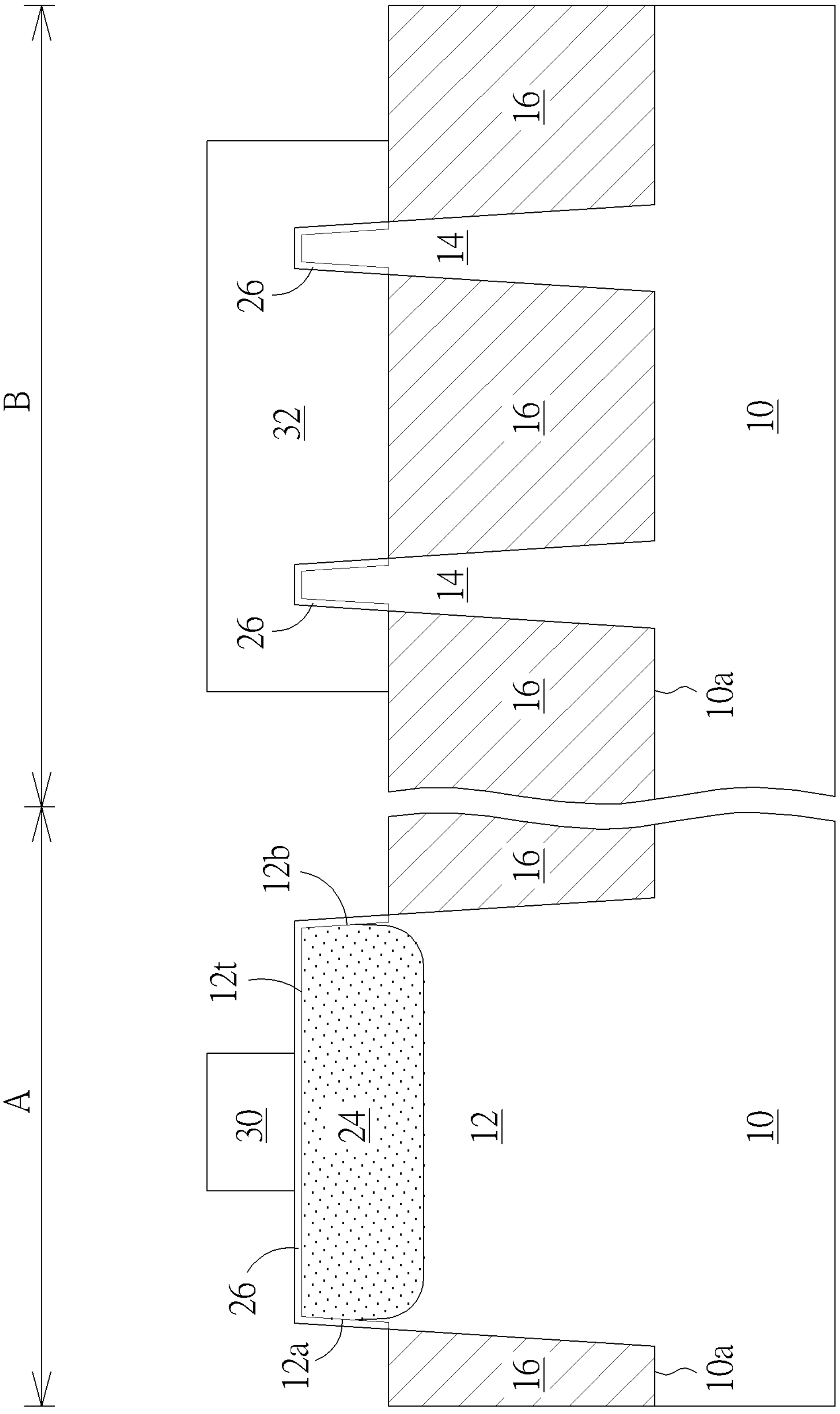
Figure 4:
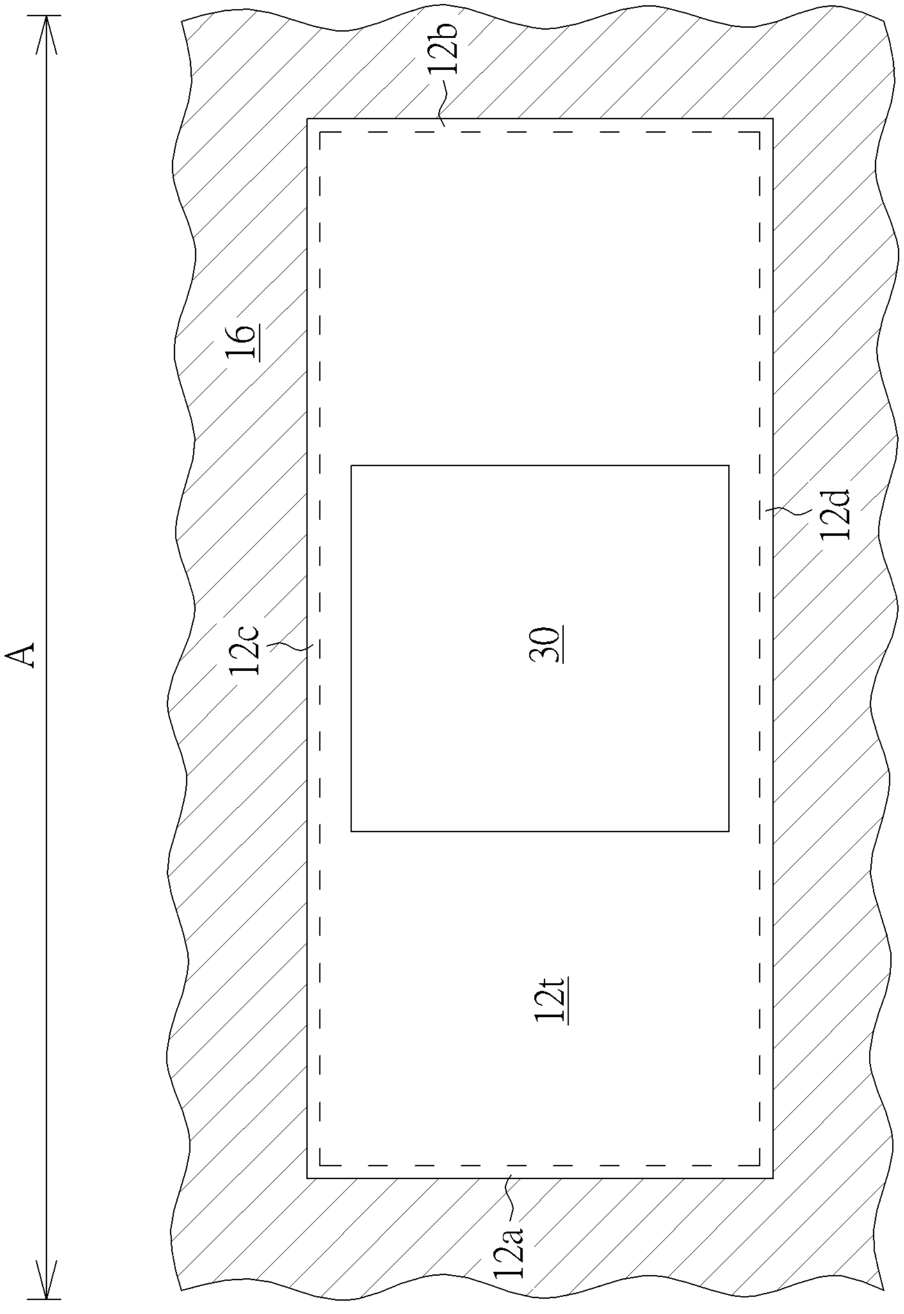

As shown in FIG. 3, the polysilicon layer 28 is patterned to form a dummy capacitor electrode 30 in the capacitor region A and a dummy gate electrode 32 in the fin transistor region B. Please also refer to FIG. 4, which is a top view of the capacitor region in FIG. 3. In order to clearly illustrate the relative position between the dummy capacitor electrode 30 and the mesa 12, the silicon oxide layer 26 is omitted in FIG. 4. As shown in FIG. 4, the mesa 12 includes a top surface 12*t* and four sloping surfaces 12*a*/12*b*/12*c*/12*d*. The sloping surfaces 12*a*/12*b*/12*c*/12*d* and the top surface 12*t* are separated by dotted lines. The dummy capacitor electrode 30 is only disposed on the top surface 12*t* of the mesa 12, and the entire dummy capacitor electrode 30 does not cover any sloping surfaces 12*a*/12*b*/12*c*/12*d*, and does not contact the STI 16.

Figure 5:
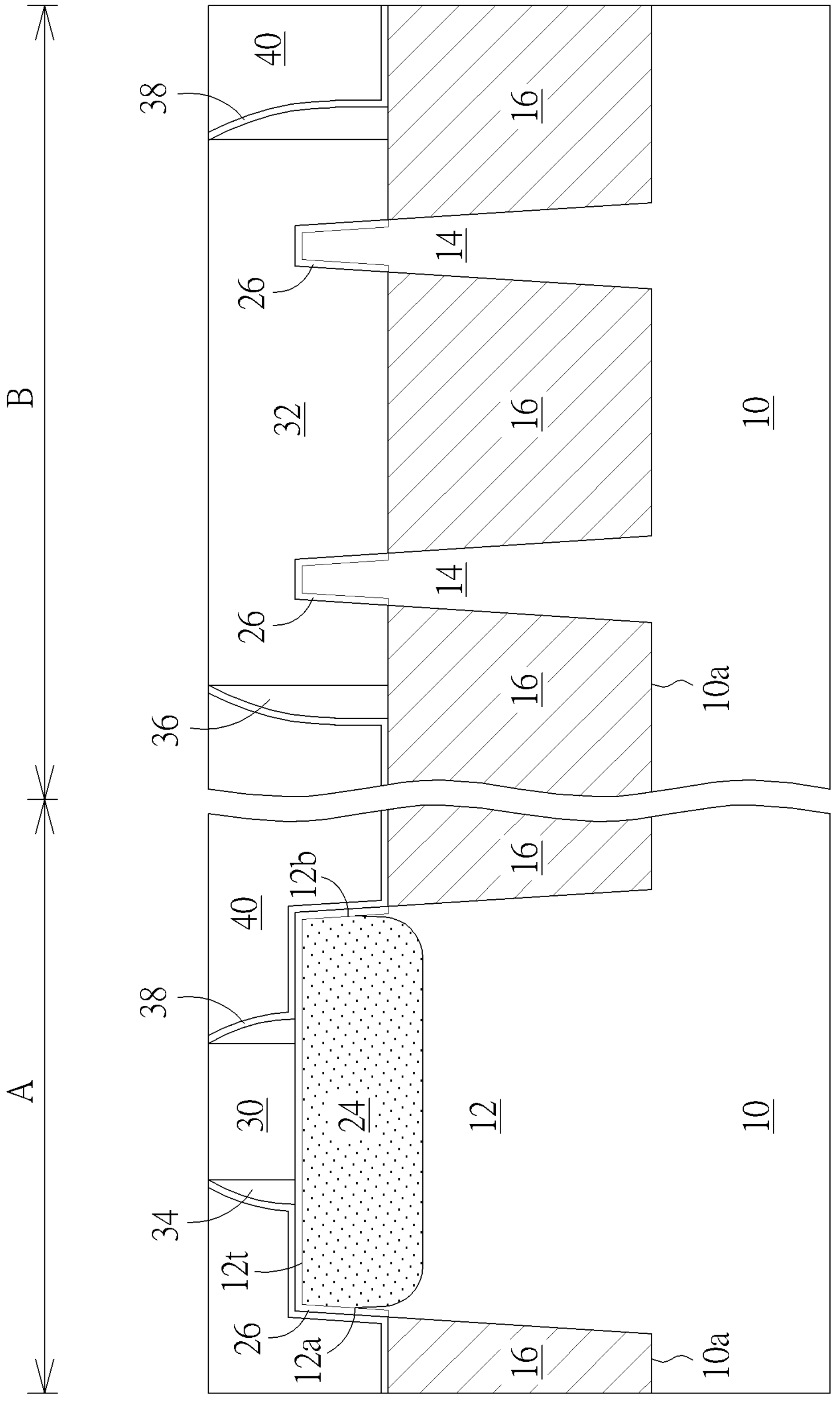

FIG. 5 is in continuous of FIG. 3. As shown in FIG. 5, two spacers 34 are formed to be disposed on two sides of the dummy capacitor electrode 30. Spacers 34 are only disposed on the top surface 12*t* of the mesa 12. Meanwhile, the other two spacers 36 are also formed on two sides of the dummy gate electrode 32. Then, a mask layer (not shown) is formed to cover the capacitor region A. Then, epitaxial layers (not shown) are formed to be embedded in the fin structures 14 at two sides of the dummy gate electrode 32. Since the mask layer covers the capacitor region A, no epitaxial layer is formed in the capacitor region A. Then, the mask layer is removed. Thereafter, an etching stop layer 38 is formed to cover the spacers 34, the dummy capacitor electrode 30, the spacers 36, the dummy gate electrode 32 and the epitaxial layers. Then, a dielectric layer 40 is formed to cover the capacitor region A and the fin transistor region B. Then, the dielectric layer 40 and the etching stop layer 38 are etched back until the top surface of the dummy capacitor electrode 30 and the top surface of the dummy gate electrode 32 are exposed through the dielectric layer 40.

Figure 6:
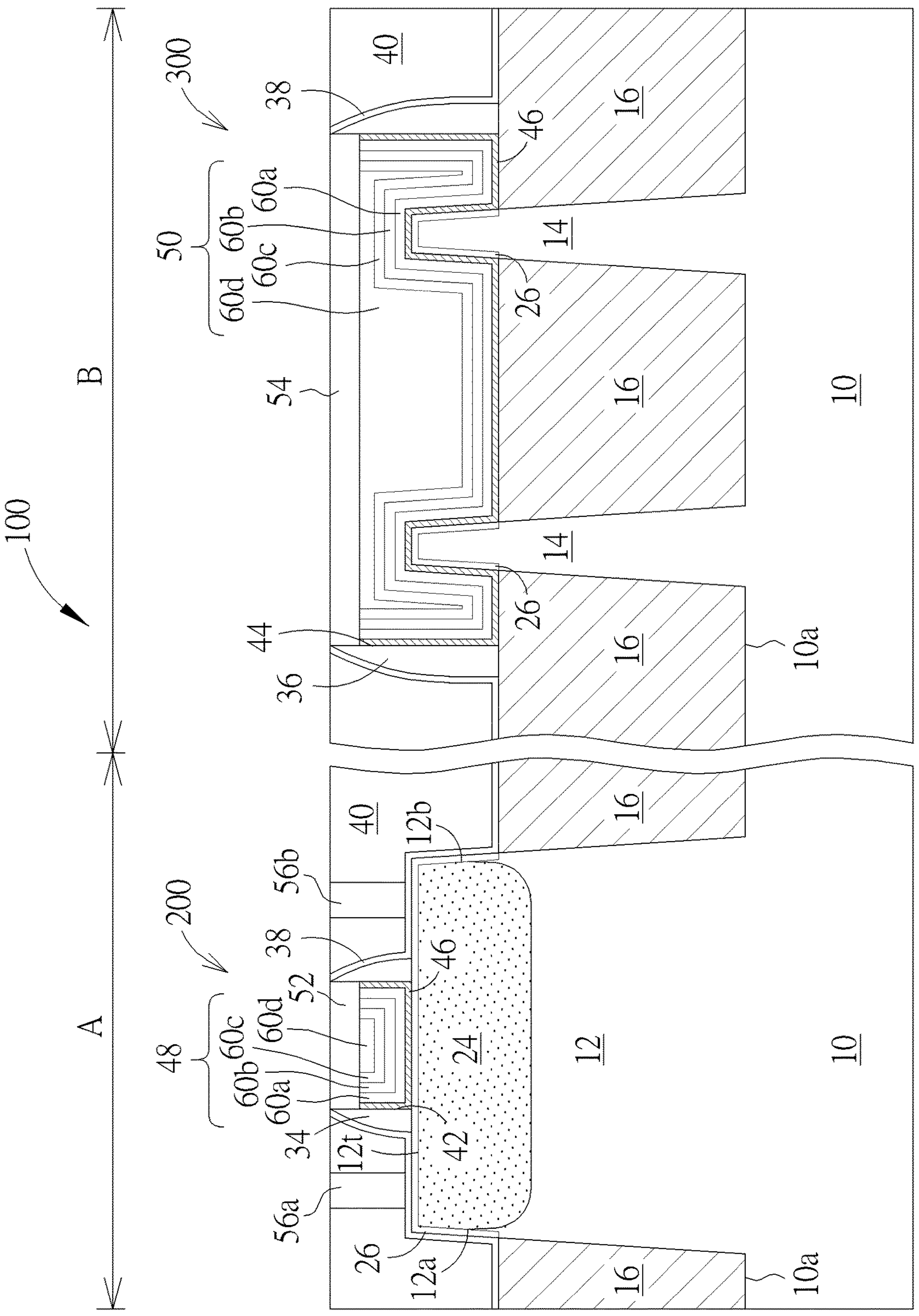

As shown in FIG. 6, the dummy capacitor electrode 30 and the dummy gate electrode 32 are removed. At this time, a recess 42 and a recess 44 are respectively formed between the spacers 34 and the spacers 36. The bottoms of the recess 42 and recess 44 are respectively covered with the silicon oxide layer 26. Later, a high-k dielectric layer 46 is formed to fill in the recess 42 and the recess 44 conformally. Then, a conductive layer is formed to fill in the recess 42 and the recess 44. The conductive layer in the recess 42 serves as a capacitor electrode 48, and the conductive layer in the recess 44 serves as a conductive gate 50. The capacitor electrode 48 and the conductive gate 50 are formed simultaneously by using the same step. Then, cap layers 52/54 are formed on the capacitor electrode 48 and the conductive gate 50 respectively. At this point, a structure 100 with a capacitor and a fin transistor of the present invention is completed. The high-k dielectric layer 46 and the silicon oxide layer 26 in the capacitor region A serve as a capacitor dielectric layer of the capacitor 200. The high-k dielectric layer 46 and the silicon oxide layer 26 in the fin transistor 300 serve as a gate dielectric layer of the fin transistor 300.

Figure 7:
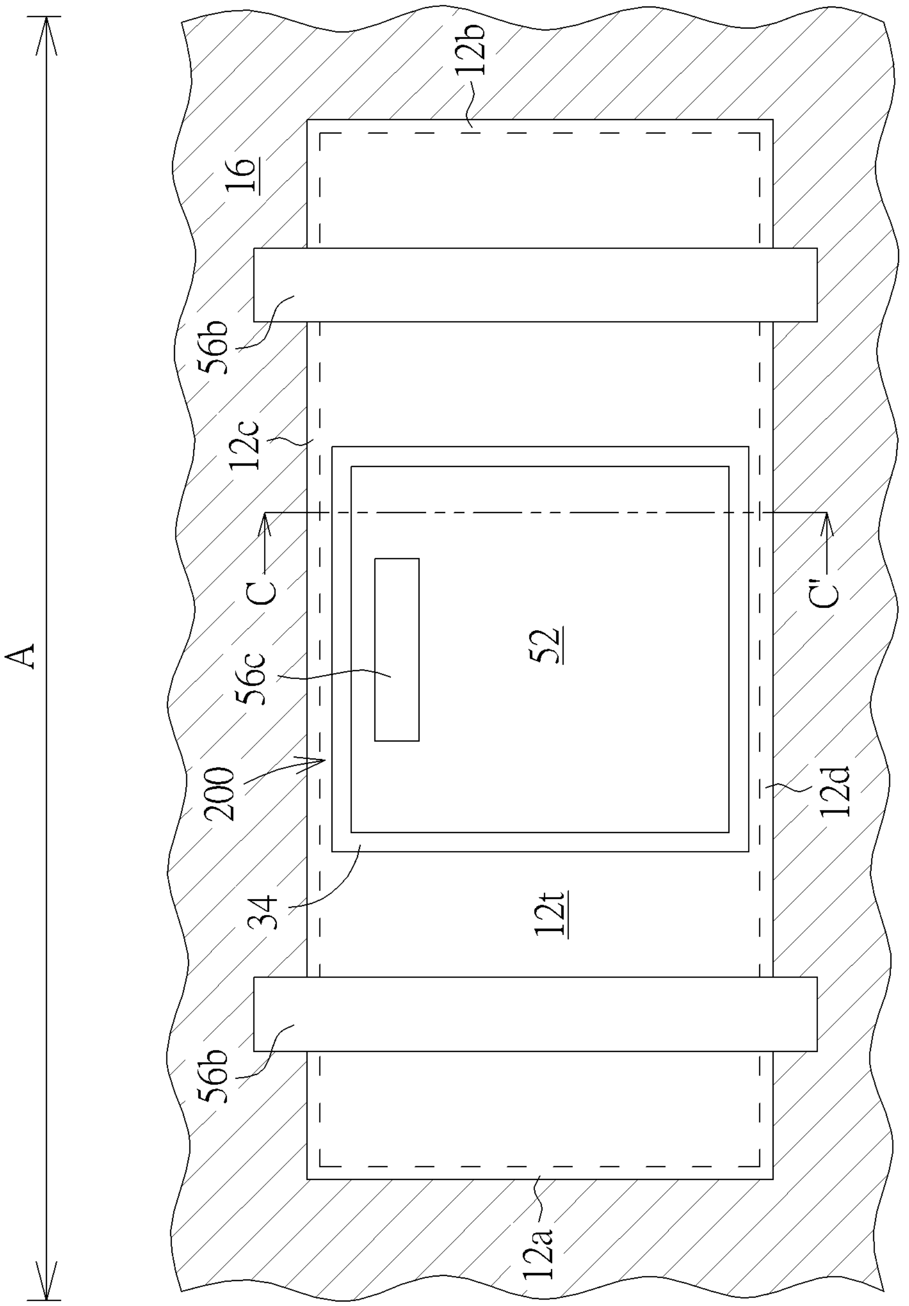
FIG. 7 shows a top view of a capacitor region in FIG. 6.

FIG. 7 shows a top view of a capacitor region in FIG. 6, wherein the silicon oxide layer, the dielectric layer and the etching stop layer are omitted in FIG. 7.

As shown in FIG. 7, contact plugs 56*a*/56*b* can be respectively formed on the mesa 12 at two sides of the capacitor electrode 48 and a contact plug 56*c* can be formed on the capacitor electrode 48. The contact plugs 56*a*/56*b* contact the doping region 24, and the contact plug 56*c* penetrates the capping layer 52 to contact the capacitor electrode 48. While forming the contact plugs 56*a*/56*b*/56*c*, contact plugs (not shown) are also respectively formed on the fin transistor 300 to contact the epitaxial layers and the conductive gate 50.

Figure 8:
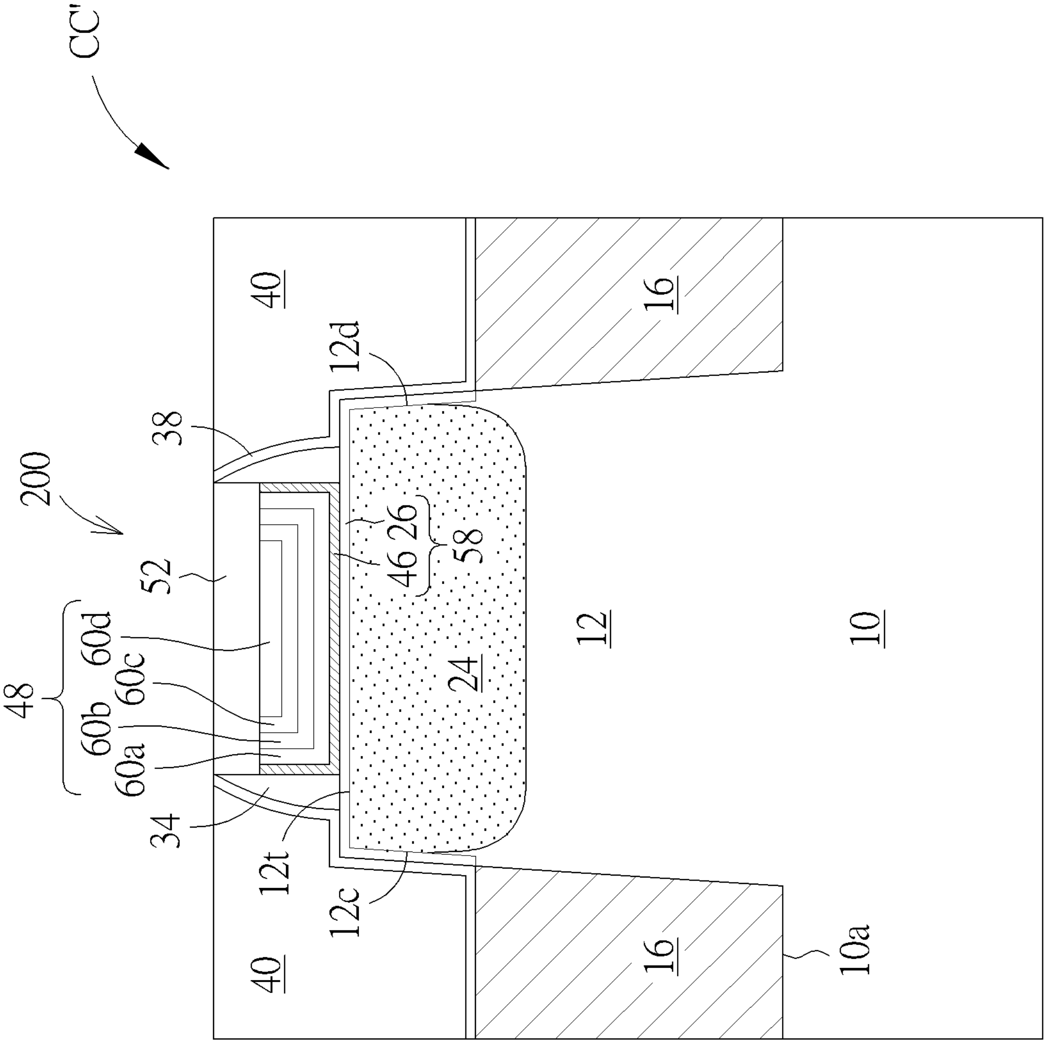
FIG. 8 depicts a sectional view taken along line CC' in FIG. 7.

FIG. 8 depicts a sectional view taken along line CC' in FIG. 7. Please refer to FIG. 6 to FIG. 8. A structure 100 with a capacitor and a fin transistor of the present invention includes a substrate 10. The substrate 10 includes a capacitor region A and a fin transistor region B. The substrate 10 may be a silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A mesa 12 is disposed in the capacitor region A of the substrate 10. The mesa 12 protrudes from a surface 10*a* of the substrate 10. The mesa 12 includes a top surface 12*t* and four sloping surfaces 12*a*/12*b*/12*c*/12*d*. Each of the sloping surfaces 12*a*/12*b*/12*c*/12*d* connects the top surface 12*t* of the mesa 12 to the surface 10*a* of the substrate 10. The STI 16 is disposed on the surface 10*a* of the substrate 10 and contacts the sloping surfaces 12*a*/12*b*/12*c*/12*d*. The STI 16 is preferably silicon oxide. A doping region 24 is disposed within the mesa 12, and a capacitor electrode 48 is only disposed on the top surface 12*t* of the mesa 12. That is, the capacitor electrode 48 does not cover any of the sloping surfaces 12*a*/12*b*/12*c*/12*d* of the mesa 12. A capacitor dielectric layer is disposed between capacitor electrode 48 and doping region 24. The capacitor dielectric layer 58 is formed by of a silicon oxide layer 26 and a high-k dielectric layer 46. The silicon oxide layer 26 contacts and covers the top surface 12*t* and the sloping surfaces 12*a*/12*b*/12*c*/12*d*. The high-k dielectric layer 46 is located between the capacitor electrode 48 and the silicon oxide layer 26. The spacers 34 are disposed on two sides of the capacitor electrode 48.

The spacers 34 are only disposed on the top surface 12*t* of the mesa 12. In addition, the doping region 24 preferably includes phosphorus or arsenic. The capacitor 200 of the present invention is composed of the capacitor electrode 48, the capacitor dielectric layer 58 and the doping region 24. The doping region 24 serves as a lower electrode of the capacitor 200, and the capacitor electrode 48 serves as a top electrode of the capacitor 200. Furthermore, there is no epitaxial layer disposed in the capacitor region A.

Moreover, at least one fin structure 14 is disposed in the fin transistor region B. In this embodiment, two fin structures 14 are shown as an example. The fin structure 14 protrudes from the surface 10*a* of the substrate 10. A conductive gate 50 crosses the fin structure 14. A gate dielectric layer is disposed between the conductive gate 50 and the fin structure 14. The gate dielectric layer is composed of a silicon oxide layer 26 and a high-k dielectric layer 46. The spacers 36 are disposed at two sides of the conductive gate 50. The conductive gate 50 and the capacitor electrode 48 have the same stacked material layer. For example, the stacked material layer includes a lower metal barrier layer 60*a*, a work function layer 60*b*, an upper metal barrier layer 60*c* and a metal layer 60*d*. The lower metal barrier layer 60*a*, the work function layer 60*b*, the upper metal barrier layer 60*c* and the metal layer 60*d* are arranged in an order from close to the spacers 34/38 to far away from the spacers 34/38. The lower metal barrier layer 60*a* includes titanium nitride and tantalum nitride. The titanium nitride is closer to the spacers 34/38, and the tantalum nitride is farther away from the spacers 34/38. The work function layer 60*b* includes a P-type work function layer and an N type work function layer. The P-type work function layer is closer to the spacers 34/38, and the N-type work function layer is farther away from the spacers 34/38. Alternatively, the work function layer 60*b* can only include an N-type work function layer or only include a P-type work function layer. The upper metal barrier layer 60*c* is made of titanium nitride, and the metal layer 60*d* is made of tungsten.

Figure 9:
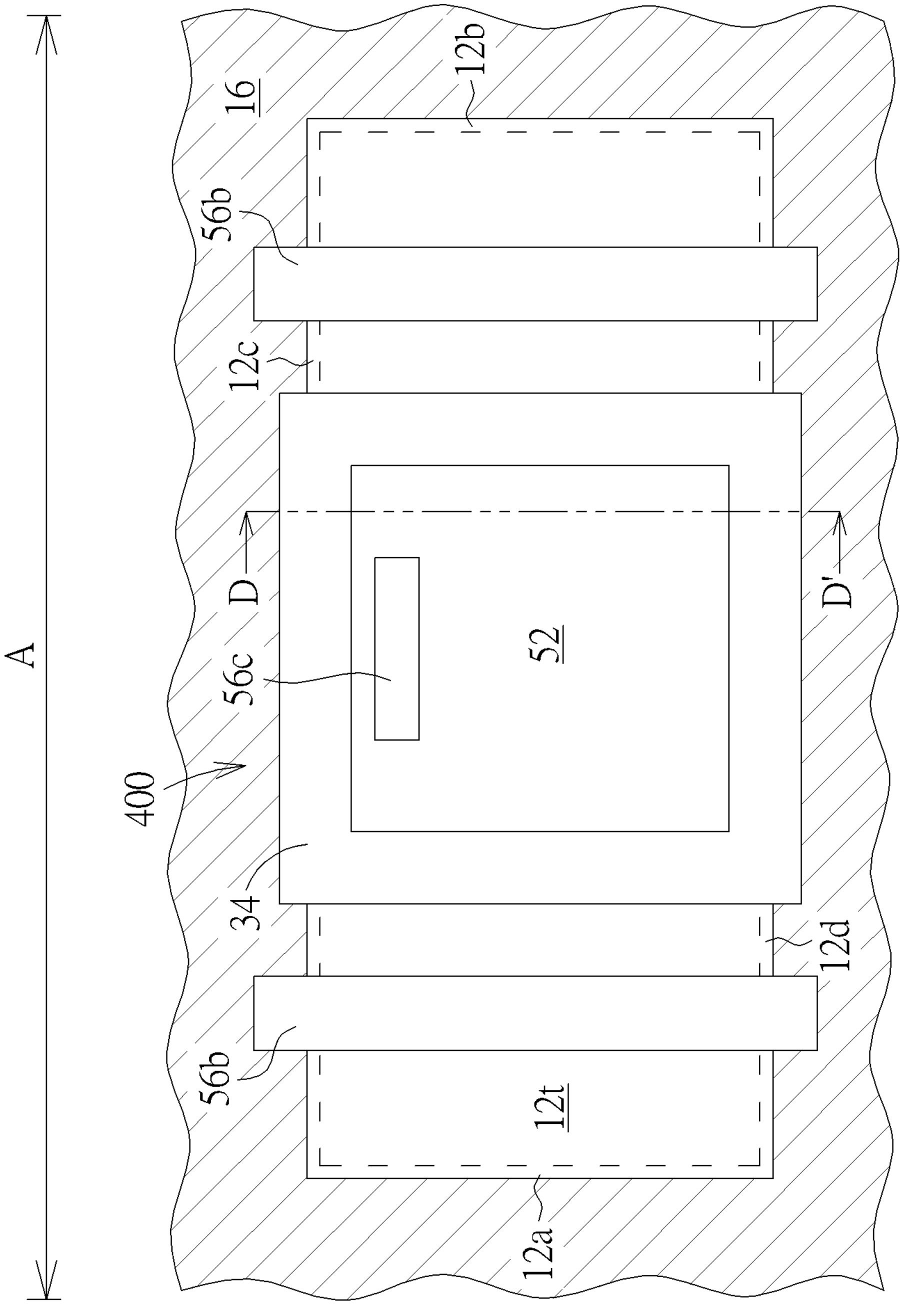
FIG. 9 shows a varied type of a capacitor according to another preferred embodiment of the present invention.
Figure 10:
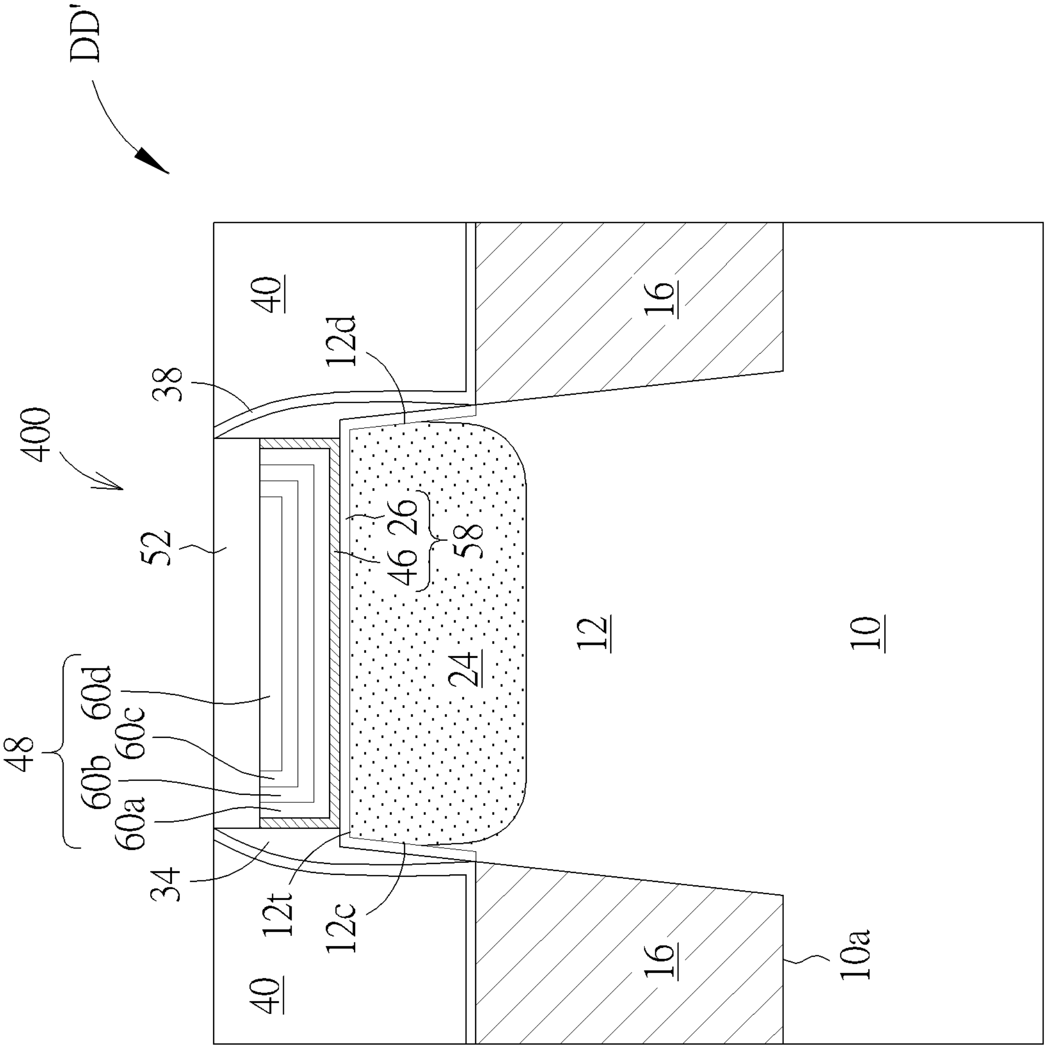
FIG. 10 depicts a sectional view taken along line DD' in FIG. 9.

FIG. 9 shows a varied type of a capacitor according to another preferred embodiment of the present invention, wherein elements which are substantially the same as those in the embodiment of FIG. 7 and FIG. 8 are denoted by the same reference numerals; an accompanying explanation is therefore omitted. FIG. 10 depicts a sectional view taken along line DD' in FIG. 9.

As shown in FIG. 9 and FIG. 10, the difference between the capacitor 400 in FIG. 9 and the capacitor 200 in FIG. 8 is the position where the spacers 34 cover. In FIG. 10, the spacers 34 at two sides of the capacitor 400 cover the top surface 12*t* of the mesa 12 and the sloping surfaces 12*c*/12*d* of the mesa 12. The spacers 34 in FIG. 8 is only located on the top surface 12*t* of the mesa 12 and does not cover sloping surfaces 12*c*/12*d*. Other components in FIG. 9 are the same as those in FIG. 8 and the description is therefore omitted here.

Because the bottom of the doping region is close to the top surface of the mesa, there will be no doping region inside the sloping surfaces which is close to the STI. If the capacitor electrode covers the sloping surfaces, there will be an undoped region under the capacitor electrode. In this way, the capacitance will become unstable. Therefore, the present invention specially arranges the capacitor electrode only on the top surface of the mesa to ensure that all region under the capacitor electrode is arranged with the doping region, thereby reducing the variation in capacitance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure with a capacitor and a fin transistor, comprising:

a substrate comprising a capacitor region and a fin transistor region;

a mesa disposed within the capacitor region of the substrate, wherein the mesa protrudes from a surface of the substrate, the mesa comprises a top surface and two sloping surfaces, and each of the sloping surfaces connects to the top surface of the mesa and the surface of the substrate;

a doping region disposed within the mesa;

a capacitor electrode only disposed on the top surface of the mesa;

a spacer disposed on one side of the capacitor electrode, wherein the spacer covers the top surface of the mesa and one of the two sloping surfaces of the mesa; and a capacitor dielectric layer disposed between the capacitor electrode and the doping region.

2. The structure with a capacitor and a fin transistor of claim 1, wherein the capacitor dielectric layer comprises a silicon oxide layer, and the silicon oxide layer contacts and covers the top surface of the mesa and the two sloping surfaces of the mesa.

3. The structure with a capacitor and a fin transistor of claim 1, further comprising a shallow trench isolation disposed on the surface of the substrate and contacting one of the two sloping surfaces.

4. The structure with a capacitor and a fin transistor of claim 1, further comprising:

a fin structure disposed in the fin transistor region, wherein the fin structure protrudes from the surface of the substrate;

a conductive gate crossing the fin structure; and a gate dielectric layer disposed between the conductive gate and the fin structure; wherein the conductive gate and the capacitor electrode have the same stacked material layer.

5. The structure with a capacitor and a fin transistor of claim 1, wherein the doping region comprises phosphorus or arsenic.

* * * * *